(12) United States Patent
Weng et al.

(10) Patent No.: US 8,057,656 B2
(45) Date of Patent: Nov. 15, 2011

(54) CROSSOVER

(75) Inventors: Jian-gang Weng, Corvallis, OR (US);
Peter Mardilovich, Corvallis, OR (US);
John Christopher Rudin, Bristol (GB)

(73) Assignee: Hewlett-Packard Development Company, LP, Houston, TX (US)

( * ) Notice: Subject to any disclaimer, the term of this patent is extended or adjusted under 35 U.S.C. 154(b) by 610 days.

(21) Appl. No.: 12/251,020

(22) Filed: Oct. 14, 2008

(65) Prior Publication Data

US 2010/0089630 A1 Apr. 15, 2010

Related U.S. Application Data

(60) Provisional application No. 61/024,900, filed on Jan. 30, 2008.

(51) Int. Cl.
*C25D 5/02* (2006.01)
*H01L 21/00* (2006.01)
(52) U.S. Cl. .......................... 205/122; 205/171; 438/29
(58) Field of Classification Search ................ 205/122, 205/171; 438/29
See application file for complete search history.

(56) References Cited

U.S. PATENT DOCUMENTS

| 6,967,118 B2 | 11/2005 | Weng et al. |
| 7,160,745 B2 | 1/2007 | Ulmer et al. |
| 2007/0026554 A1 | 2/2007 | Nomoto |
| 2007/0033796 A1 | 2/2007 | Rudin |

*Primary Examiner* — Luan Van

(57) ABSTRACT

A crossover is formed by imprinting a channel, by depositing a first conductor in the channel, by anodizing a surface of the first conductor and by electroforming a second conductor across the first conductor.

19 Claims, 16 Drawing Sheets

FIG. 14

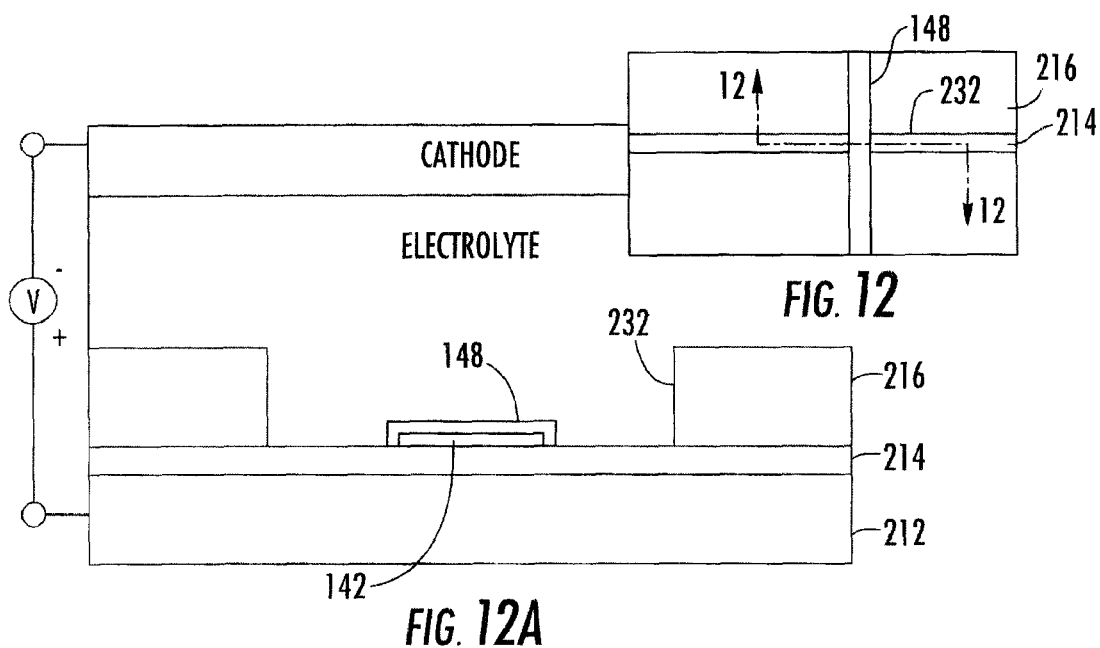
FIG. 12
FIG. 12A
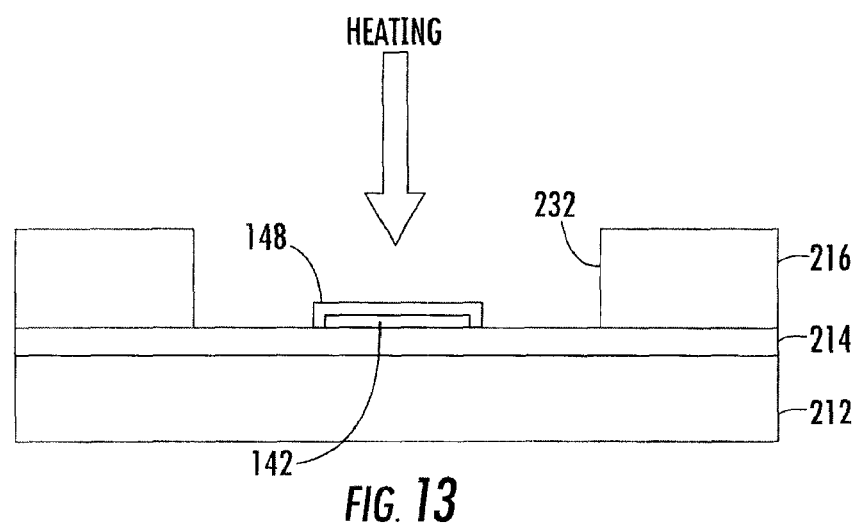
FIG. 13

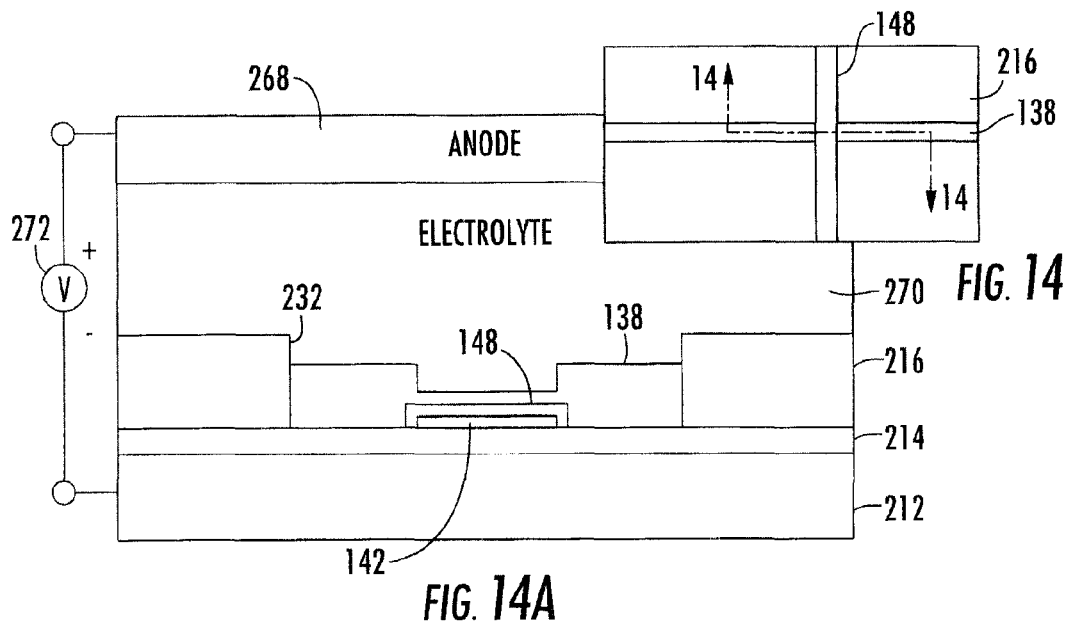
FIG. 14
FIG. 14A
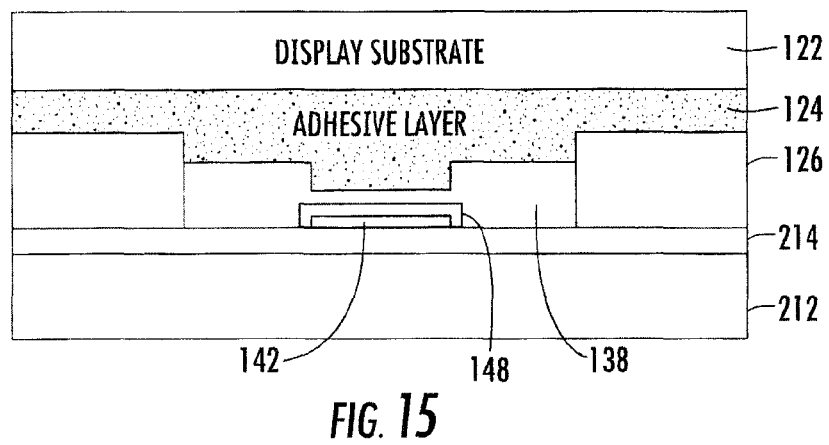
FIG. 15

CROSSOVER

CROSS REFERENCE TO RELATED APPLICATION

This Application claims the benefit of U.S. Provisional Application Ser. No. 61/024900, filed Jan. 30, 2008, titled "Crossover" which is hereby incorporated by reference herein as if reproduced in full below.

BACKGROUND

Electronic devices, such as displays and printers, sometimes include a grid or array of individual pixels or cells which are selectively activated using a grid of electrical signal lines or traces. Electrically insulating the signal lines from one another where they cross over one another is difficult, costly and sometimes unreliable.

BRIEF DESCRIPTION OF THE DRAWINGS

FIG. 12 is a top plan view illustrating further anodization of the first metal within the channel to form a dielectric layer according to an example embodiment.

FIG. 12A is a sectional view illustrating anodization of the first metal of FIG. 12 taken along line 12-12 according to example embodiment.

FIG. 13 is a sectional view illustrating annealing of the dielectric layer according to one exemplary embodiment.

FIG. 14 is a top plan view illustrating electrodeposition of a second metal across the dielectric layer to form a crossover according to an example embodiment.

FIG. 14A is a sectional view of the electrodeposition of FIG. 14 taken along line 14-14 according to an example embodiment.

FIG. 15 is a sectional view illustrating the coupling of a display substrate according to one exemplary embodiment.

In certain sectional views, selected lines or portions have been omitted for ease of illustration.

DETAILED DESCRIPTION OF THE EXAMPLE EMBODIMENTS

Figure 1:
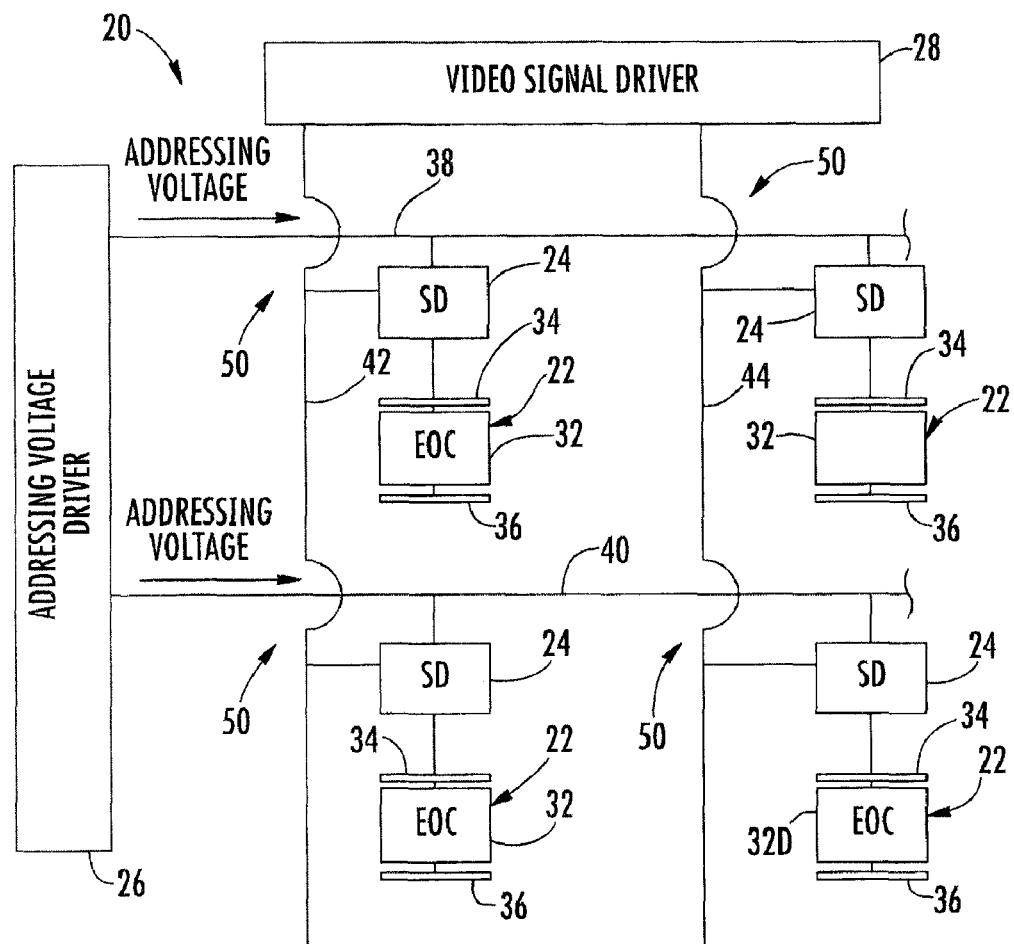
FIG. 1 is a schematic illustration of an electronic device including crossovers according to an example embodiment.

FIG. 1 is a schematic illustration of an example electronic device including a grid of electrical signal lines or traces end of their associated crossovers. As will be described hereafter, such crossovers are formed in a less complex and more cost-efficient manner.

In the example illustrated, the electronic device is a display 20 which is shown as an active matrix electro-optical display. Display 20 generally includes electro-optical cells 22, switching devices 24, addressing voltage driver 26, video signal driver 28, select or address lines 38, 40 and signal lines 42, 44. Electro-optical cells 22 comprise individual cells arranged in a matrix or array and configured to alter or block the transmission of light to produce a visual display or image. Each cell 22 forms a pixel of display 20. Electro-optical cells 22 each generally includes an electro-optical media 32 which is configured to change light altering or blocking states in response to applied electrical field or electrical current. In the particular example shown, electro-optical media 32 includes liquid crystals. In other embodiments, electro-optical material 32 may comprise other material configured to change between different light attenuating or transmitting states based upon an applied electrical field or current. In still other embodiments, display 20 may comprise other forms of displays, including, but not limited to, emissive displays such as organic light emitting diode displays.

In the example illustrated, each cell 22 includes a pair of electrodes 34, 36 in which the electro-optical media 32 is sandwiched. In one embodiment, electrode 34 is configured to receive electrical signals from video signal driver 28 depending upon the state of the associated switching device 24. Electrode 36 is electrically connected to ground. In other embodiments, electrode 36 is electrically connected to a controlled voltage source so as to have a distinct electrical potential as compared to electrode 34 so as to form an electrical field across electro-optical material 32. In one embodiment which display 20 is a transmissive display and where a backlight is implemented, both electrodes 34 and 36 are transparent. In another embodiment where display 20 is a reflective display, the electrode 36 is transparent while the electrode 34 is reflective. Electrodes 34, 36 form an electrical field across electro-optical media 32 to selectively vary and control the light-altering or blocking nature or state of electro-optical media 32 and of cell 22.

Switching devices 24 comprise devices configured to be selectively actuated between electrically conducting and non-conducting states. In one embodiment, switching devices 24 comprised transistors which actuate between electrically conducting and non-conducting states based upon electrical charge applied to the gate by addressing voltage driver 26 and addressing lines 38 and 40. In the electrically conducting state, switching devices 24 conduct the electrical signals from video signal driver 28 and signal lines 42, 44 to the electrode 34 of the associated cell 22. In other embodiments, switching devices 24 may comprise other forms of logical switching devices such as metal-insulator-metal devices (MIMs), diodes and the like. In yet other embodiments in which the display pixels 20 is operating in the in-plane switching mode, the switching devices 24 do not exist and the display is driven by a passive matrix control scheme with the addressing lines 38 and 40 directly connected to electrodes 34 and the signal lines 42 and 44 directly connected to electrodes 36.

Addressing voltage driver 26 comprises an electronic component configured to transmit electrical voltages to switching devices 24 via addressing lines 38, 40 as shown in FIG. 1. The addressing voltages transmitted by driver 26 represent "select" and "non-select" conditions to switch each switching device 24 between an electrically conducting state and a non-conducting state. Alternatively, when the "non-select" condition is met, a particular switching device 24 is turned into a non-conducting state and its associated electro-optical media 32 is not charged or addressed by video signals from driver 28.

Video signal driver 28 comprises an electronic component configured to transmit video signals, in the form of electrical voltages, to electro-optical media 32 via video signal lines 42, 44. The video signals transmitted by driver 28 charge the electro-optical media 32 of those cells 22 that are being addressed, resulting from the associated switching 24 being actuated to a conducting state by driver 26.

As schematically shown by FIG. 1, address lines 38, 40 extend across the grid of display cells 22. Signal lines 42, 44 also extend across the grid of display cells 22 generally orthogonal to address lines 38, 40. Address lines 38, 40 and signal lines 42, 44 cross one another at crossovers 50. Although FIG. 1 illustrates a pair of address lines and a pair of signal lines, it should be understood that display 20 includes a grid or array of such address lines and signal lines including greater than a pair of each of such lines. Although signal lines 42, 44 are illustrated as crossing over address lines 38, 40, in other embodiments, address lines 38, 40 may alternatively cross over signal lines 42, 44. Although such crossovers 50 are illustrated as being utilized in display 20 having a grid of display cells 22, in other embodiments, crossovers 50 may be utilized in other electronic devices such as in other display architectures or such as in other non-display devices where a grid of electrical lines are utilized across a matrix of selectively actuated elements.

Figure 2:
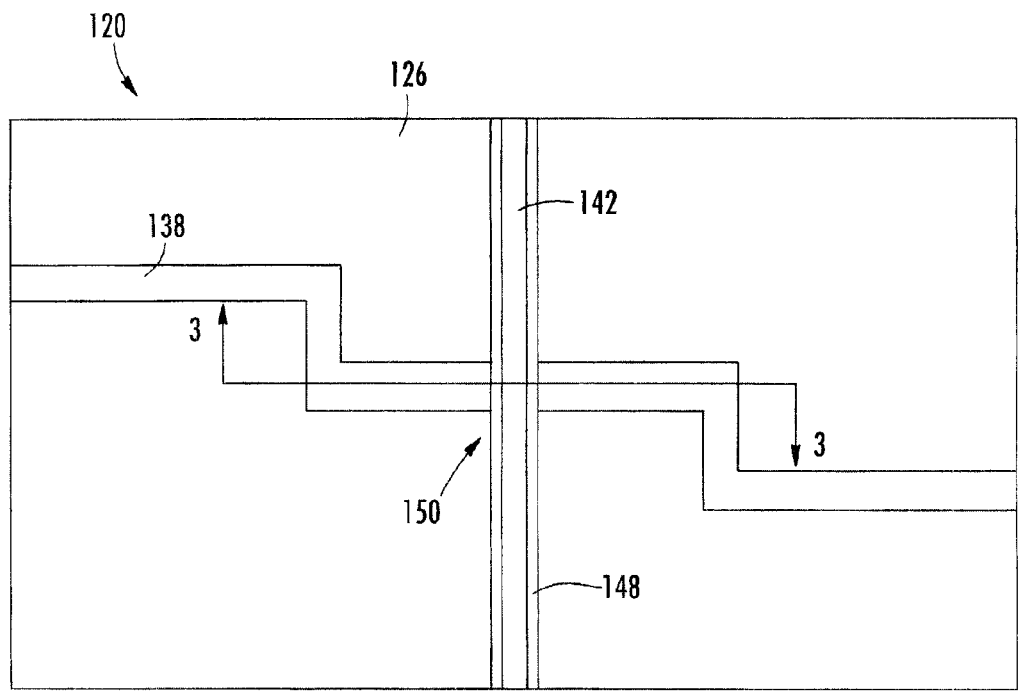
FIG. 2 is a top plan view of an electronic device backplane including a particular embodiment of a crossover according to an example embodiment.
Figure 3:
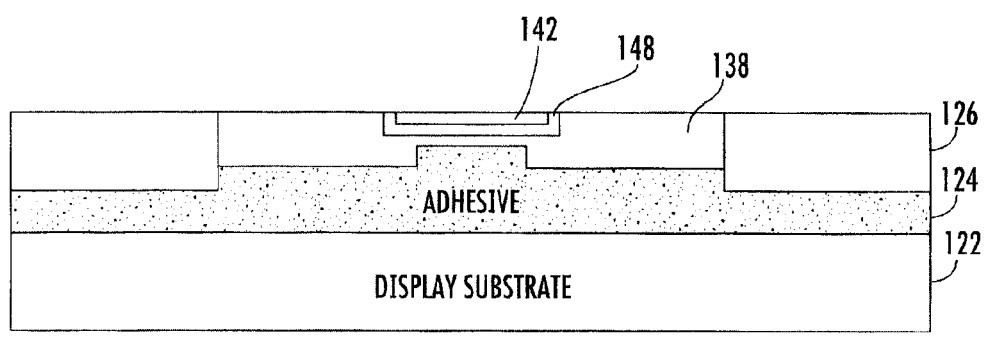
FIG. 3 is a sectional view of the backplane of FIG. 2 taken along a line 3-3 according to an example embodiment.

FIGS. 2 and 3 illustrate a portion of an electronic device backplane 120 including crossovers 150, a particular example of one of crossovers 50 shown in FIG. 1. FIG. 2 is a top plan view of backplane 120. FIG. 3 is a sectional view of backplane 120 taken along line 3-3 of FIG. 2. Backplane 120 includes substrate 122, adhesive 124, dielectric layer 126, conductor 138, conductor 142 and dielectric layer 148 which forms crossover 150. Substrate 122 supports dielectric layer 126, conductor 138, conductor 142 and dielectric layer 148. In the example illustrated, dielectric layer 126, conductor 138, conductor 142 and dielectric layer 148 are collectively joined, bonded, adhered or laminated to substrate 122 by adhesive 124. In one embodiment, substrate 122 comprises a polymeric or plastic substrate, such as polyethyleneteraphalate (PET), facilitating roll-to-roll fabrication. In another embodiment, substrate 122 comprises a glass substrate. In one embodiment in which substrate 122 is formed from PET, substrate 122 has a thickness of between about 50 microns and about 200 microns. In other embodiments, substrate 122 may be formed from other materials and may have other thicknesses.

Adhesive 124 comprises a layer of one or more materials configured to adhesively contact dielectric layer 126 and conductor 138 so as to join such layers to substrate 122. In one embodiment, adhesive 124 comprises NOA81, an adhesive supplied by Norland Products, Inc. In one embodiment, adhesive layer 124 has a thickness of between about 5 microns and 20 microns. In other embodiments, adhesive layer 124 may be formed from other materials and may have other thicknesses.

Dielectric layer 126 comprises one or more layers of one or more dielectric materials extending about and along opposite sides of conductor 138 and dielectric layer 148. In one embodiment in which boundaries of conductors 138 and 142 and dielectric layer 148 are at least partially defined by embossings or imprintings made into layer 126, layer 126 is formed from one or more dielectric materials configured to be embossed or imprinted and to subsequently be cured or solidified. In one embodiment, dielectric layer 126 may be formed from a photo curable material. One example of such a photo curable material is SU8 commercially available from Micro-Chemical Corporation. In other embodiments, other photo curable dialectic materials maybe used to form layer 126.

Conductors 138, 142 comprise lines or traces of electrically conductive material formed upon substrate 122 and configured to conduct electrical current. In particular example illustrated, conductor 138 is formed from one or more metals capable of electrolytic deposition and good conductivity. Examples of such metals include, but are not limited to, nickel, copper, silver, gold, tantalum and palladium. Conductor 142 comprises an electrically conductive material configured to be anodized. Examples of such materials, include, but are not limited to, tantalum, aluminum, niobium, tungsten, and alloys thereof. In other embodiments, other conductive materials may be employed. Conductors 138, 142 may serve as address lines and signal lines in an electronic device similar to lines 38 and 42 in device 20 shown in FIG. 1.

Dielectric layer 148 comprises a layer of sufficient thickness and of one or more selected materials so as to electrically insulate conductors 138 and 142 from one another at crossover 150. Layer 148 extends along three sides (as shown in FIG. 3) of conductor 142. Layer 148 is sandwiched between conductor 142 and conductor 138. In the example illustrated, layer 148 is integrally formed as part of a single unitary body with the material of conductor 142, wherein layer 148 comprises anodized portions of the material of conductor 142. In contrast to the unanodized material of conductor 142, the anodized material forming layer 148 is dielectric. Because layer 148 forming crossover 150 is formed from anodized portions of the same material deposited to form conductor 142, fabrication complexity and cost may be reduced. For example, because layer 148 is formed by anodization, photolithography may be eliminated or reduced, reducing cost and facilitating fabrication of ultra-large displays or other electronic devices. Because layer 148 is formed using anodization, low-pressure/high-temperature processes may be reduced or eliminated, facilitating use of a polymeric substrate 122. In addition, because substrate 122 may be polymeric, backplane 120 may be formed as part of a roll-to-roll process.

Figure 4:
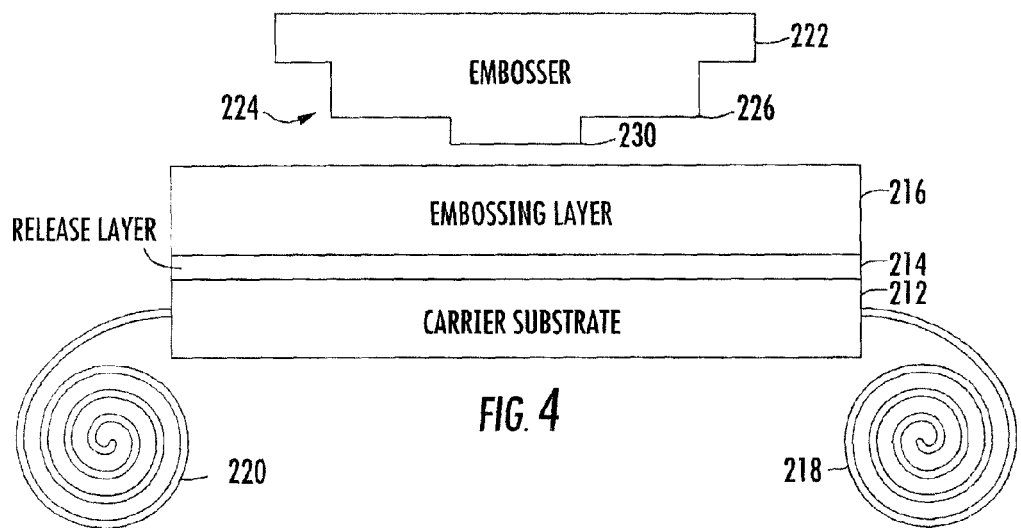
FIG. 4 is a sectional view schematically illustrating coupling of an embossing layer upon a carrier substrate according to one exemplary embodiment.

FIGS. 4-16 illustrate one example of a method for fabricating backplane 120. The method shown in FIGS. 4-16 utilizes macro-area processing techniques and does not require photolithography, reducing the complexity and cost for the fabrication of crossovers 150. As shown in FIG. 4, a carrier substrate 212 is coupled to and supports a release layer 214 and an embossing layer 216. For purposes of this disclosure, the term "coupled" means the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature.

Carrier substrate 212 comprises an electrically conductive substrate configured to support release layer 214 and embossing layer 216. In the example shown, carrier substrate 212 is provided as part of a roll-to-roll process, wherein carrier substrate 212 is wrapped about the reels 218, 220. In another embodiment, carrier substrate 212 may be supplied from a take-up reel or roll 218, wherein the substrate 212 is not rewound about a subsequent take-up reel or roll 220. In yet other embodiments, carrier substrate 212 may be supplied in sheet form or another fashions. In still other embodiments, carrier substrate number 212 may be provided as part of an endless or continuous web or belt which is reused. Carrier substrate 212 may be formed from one or more conductive materials such as copper or nickel with a highly smooth surface finish and high conductivity. Carrier substrate 212 may comprise a bulk conductor, such as a metal plate or sheet, or may comprise a dielectric sheet with a conducting surface layer.

Release layer 214 comprises a layer of material deposited upon or otherwise formed upon the surface of substrate 212 and configured to facilitate release of or separation of layer 216 or other subsequently formed layers from substrate 212. According to one exemplary embodiment, carrier substrate 212 is passivated to form release layer 214. For example, the conducting surface of a carrier substrate 212 formed from Nickel may be treated with 0.1N potassium dichromate aqueous solution for 10 minutes followed by rinsing and drying to form an oxide release layer 214. Release layer 218 may be a very thin oxide, a surfactant layer or a monolayer polymer release agent. In particular embodiments, release layer 214 may be electrically conductive.

Embossing layer 216 comprises a layer of one or more dielectric materials such that the layer may be embossed or imprinted upon by an embosser, such as an embossing shim 222, to form dielectric layer 126.

Figure 5:
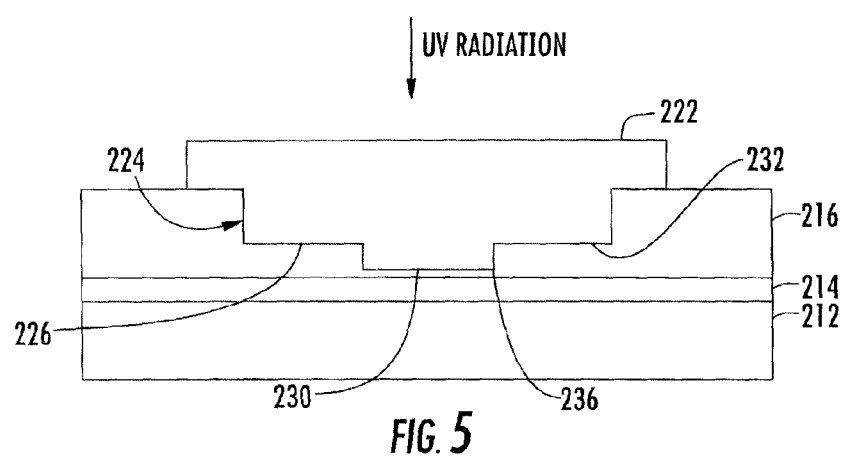
FIG. 5 is a sectional view schematically illustrating embossing or imprinting of the at least one embossing layer according to one exemplary embodiment.
Figure 6:
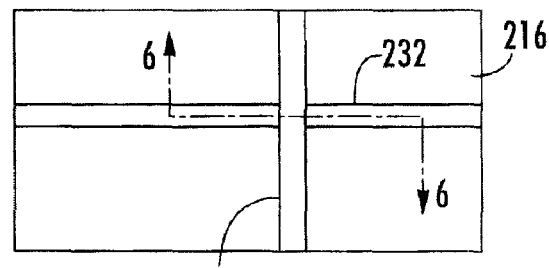
FIG. 6 is a top plan view of the imprinted embossing layer having a formed channel according to one exemplary embodiment.

FIGS. 4-6 illustrate the embossing or imprinting upon of embossing layer 216 by embosser 222. As shown by FIGS. 4 and 5, embosser 222 comprises a shim including a relief surface 224. Relief surface 224 is configured to form features within embossing layer 216 corresponding to size or edges of conductor 138 and conductor 142. In the particular example shown, relief surface 224 includes projections 226 and 230. Projection 226 forms a channel 232 within embossing layer 216 which generally corresponds to the outline of conductor 138. Projection 230 extends beyond projection 226 and is configured so as to project into layer 216 so as to form channel 236 which generally has a shape or outline of conductor 142. In one embodiment, projection 230 projects less than or equal to about 1 micron beyond projection 226. This height of projection 230 substantially defines a thickness or height of conductor 142.

Figure 6A:
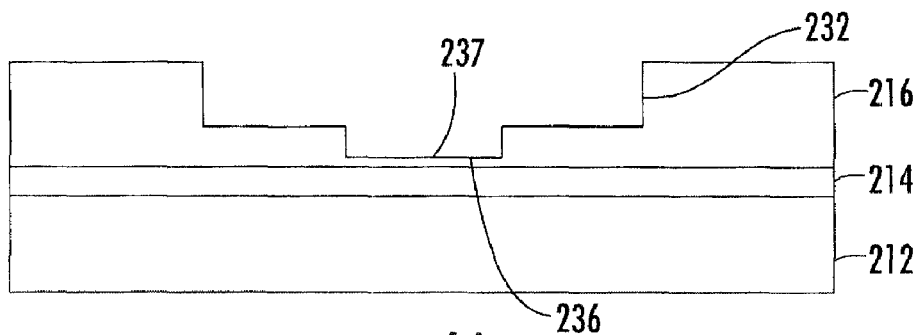
FIG. 6A is a sectional view schematically illustrating the imprinted embossing layer of FIG. 6 taken along line 6-6 according to one exemplary embodiment.

In the particular example shown, embossing layer 216 is formed from one or more materials such that embossing layer 216 has a deformable shape until treated. In the particular example shown, embossing layer 216 comprises an optically transparent UV curable dielectric resin (e.g., Norland Optical Products NOA83H). As a result, upon the application of UV illumination, the shape of embossing layer 216 becomes stabilized. In the particular example shown, embosser 222 is substantially transparent to UV wavelengths. Once embosser 222 has been positioned into layer 216 such that layer 216 takes up the form or shape of release surface 224 as shown in FIG. 5, UV illumination is applied through embosser 222 to embossing layer 216 to cure and solidify or stabilize the shape of embossing layer 216 while embosser 222 is in place. Thereafter, as shown in FIGS. 6 and 6A, embosser 222 is separated from layer 216 to expose and reveal channels 232 and 236.

In other embodiments, embossing layer 216 may comprise one or more other materials such that embossing layer 216 may be treated to stabilize the shape of embossing layer 216 by other means such as by heat, chemical reactions, thermosetting reactions, curing or cross-linking, induction heating, microwave and other forms of electromagnetic radiation and the like, while embosser 222 is positioned into layer 216 or upon removal of embosser 222 from layer 216. In still other embodiments, embossing layer 216 may be provided by other materials which do not require treatment to achieve a stabilized shape or which require treatment to achieve a deformable state which naturally stabilizes and shapes over time or which may require further treatment for shape stabilization.

Although in the particular example illustrated, embossing layer 216 is formed from one or more transparent materials, in other embodiments, embossing layer 216 may alternatively be opaque such as in those embodiments in which at least those portions of embossing layer 216 which overlie or underlie electrical optical media 32 (shown in FIG. 1) are removed during the manufacture of the display in which backplane 220 is to be used.

Figure 7:
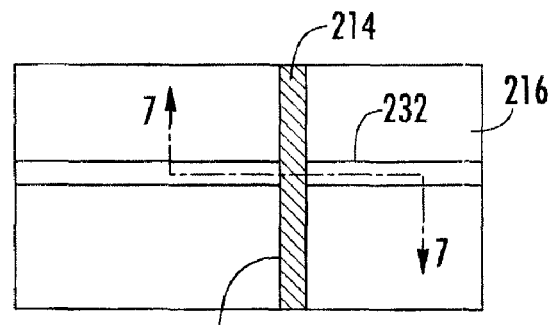
FIG. 7 is a top plan view illustrating forming an opening through the embossing layer within the channel according to one exemplary embodiment.
Figure 7A:
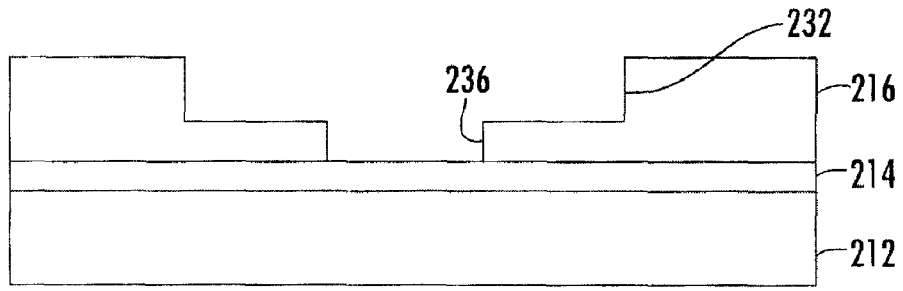
FIG. 7A is a sectional view of the opening through the embossing layer of FIG. 7 taken along line 7-7 according to an example embodiment.

FIGS. 7 and 7A illustrate further deepening of channel 236 so as to expose release layer 214. In particular, floor 237 (shown in FIG. 6) of channel 236 is removed. Examples of methods that may be used to remove floor 237 so as to deepen channel 216 and expose layer 214 include an anisotropic etching techniques such as oxygen plasma etch. Other removal techniques include UV-ozone treatment and laser ablation. In still other embodiments methods to expose layer 214 include reactive ion etching, wet etching or ion beam milling. In particular applications, the embossing or imprinting of layer 216 may be performed such that channel 236 omits a floor 237 and exposes layer 214.

Figure 8:
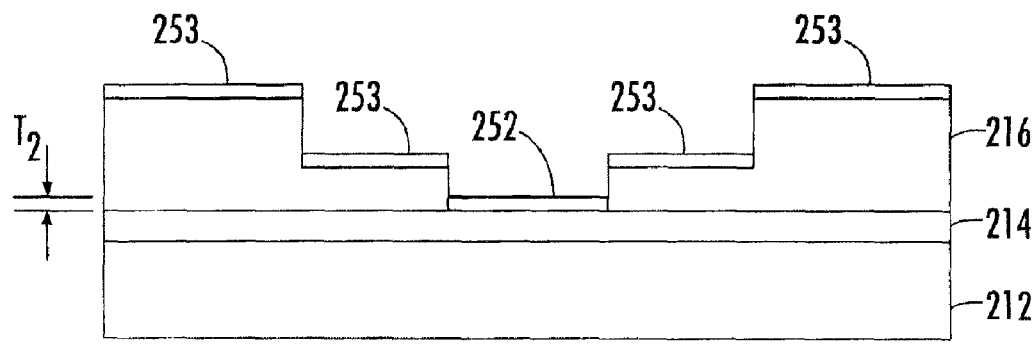
FIG. 8 is a sectional view illustrating deposition of a first metal in the channel according to one exemplary embodiment.

FIG. 8 illustrates depositing metal portion 252 in channel 236. As shown by FIG. 8, the metallic material being deposited to form metal portion 252 may cover or coat at least portions of layer 216, forming portions 253. In the example shown in FIG. 8, the metallic material of portions 252 and 253 may be deposited using such methods as thermal evaporation and sputtering. In one embodiment, portions 252 and 253 comprise tantalum. In other embodiments, the metallic material may comprise other metals whose oxides function as high-quality dielectrics such as niobium, titanium, copper, silver, aluminum, tungsten, and their alloys. In the particular example shown, metal portion 252 has a minimum thickness $T_2$ of at least 50 nm to provide sufficient material for anodization (shown in the next step) and sufficient conductivity to allow electrical current flow and a maximum thickness not exceeding the thickness of the sacrificial layer such that a lift-off process may be implemented. In the particular example shown, metal portion 252 has a thickness $T_2$ of 200 nm. In other embodiments, metal portion 252 has other thicknesses.

Figure 9:
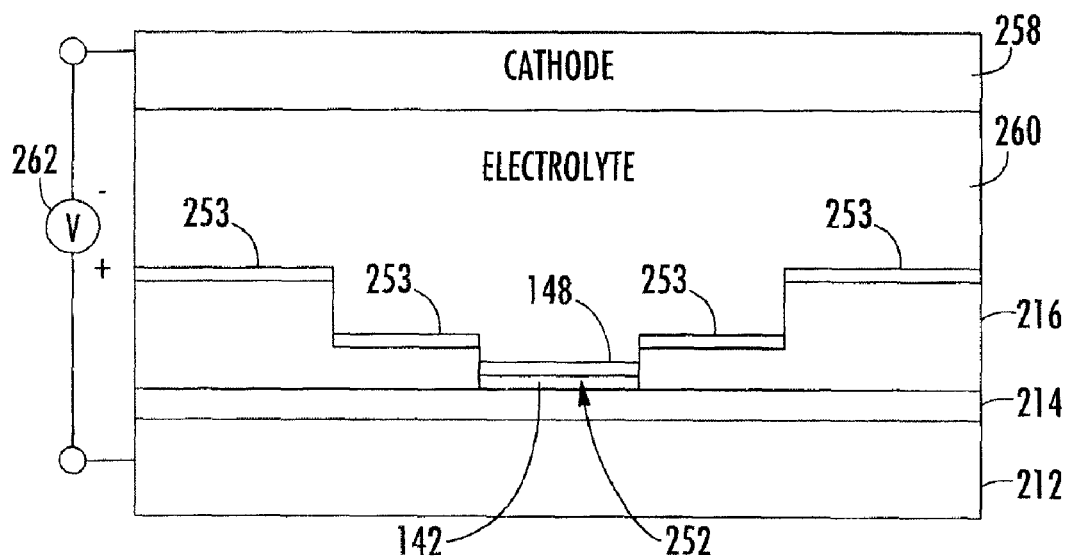
FIG. 9 is a sectional view schematically illustrating anodization of the first metal within the channel to form a dielectric layer according to an example embodiment.

FIG. 9 illustrates anodization of metal portion 252 to form a top portion of dielectric layer 148 (the bottom portion shown FIG. 3). Those portions of metal portion 252 that are not anodized or oxidized remain electrically conductive. In particular, metal portion 252 is anodized using a galvanic cell utilizing conducting substrate 212 as an anode, a cathode 258 of a suitable metal, such as platinum and a suitable electrolyte 260. In the example shown, the electrolyte may comprise a solution of citric acid. In other embodiments, electrolyte 260 may comprise a boric acid solution with pH adjusted to 7 by $NH_4OH$, a solution of ammonium tartrate, or a solution of ammonium pentaborate. In one embodiment, an example concentration is: citric acid—0.01 wt. %, all others—1 wt %. Electrolyte 260 may also include other surfactants and/or buffer materials. In one embodiment, the anodization regime is galvanostatic.

In the particular example shown in which metal portion 252 comprises tantalum having an anodization coefficient of approximately 1.8 nm/volt, voltage source 262 applies a starting current density of approximately 0.1 mA to 1.0 mA per centimeter squared. After the voltage reaches a specific value (final thickness of the $Ta_2O_5$ film is proportional to the voltage), the regime is switched to a potentiostatic regime wherein the voltage source 262 applies a relatively constant voltage to complete anodization of metal portion 252 until the current density falls to a sufficiently low value. The voltage applied by voltage source 262 and the time that the anodization is performed at constant voltage determines the thickness of dielectric layer 148.

In the particular example shown, to form a 100 nm $Ta_2O_5$ film for dielectric layer 148, voltage source 262 applies a generally constant voltage of 55V at room temperature during the final stage. As shown by FIG. 9, portions 253 are sufficiently insulated from the electrically conductive substrate 212 and therefore are not anodized. In other embodiments, the voltage applied by voltage source 262 may be varied to vary the thickness of dielectric layer 148.

Figure 10:
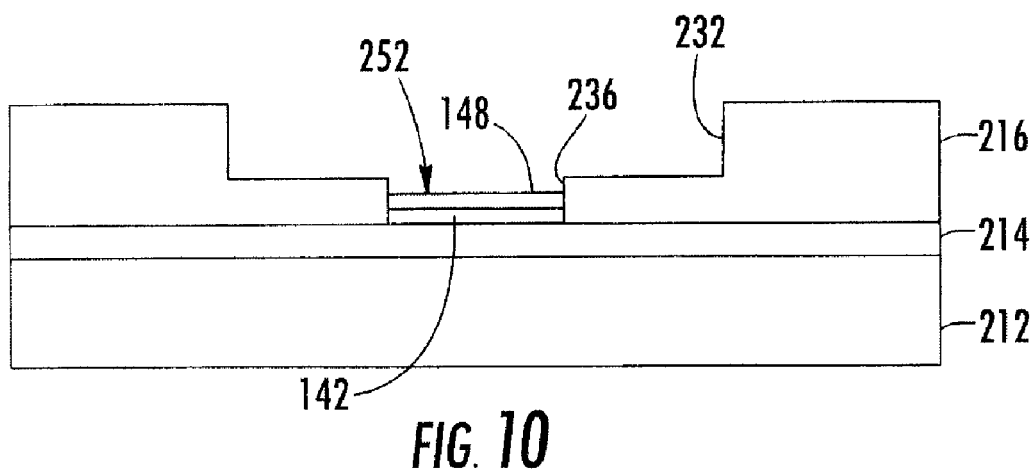
FIG. 10 is a sectional view illustrating removal of the first metal from the embossing layer according to one exemplary embodiment.

FIG. 10 illustrates removal of metallic portion 253 (shown in FIG. 9) from portions of embossing layer 216. In the particular example shown, portion 253 is removed by etching such as with a dry etch or a wet etch. The etching technique chosen provides a sufficient differential etch rate between the portion 253 and dielectric layer 148. In the particular example shown, removal of portion 253 can be achieved by wet-etching using acid based solvents such as the solvent consisting of 1 part 48% HF, 2 parts concentrated $HNO_3$, and 1 part $H_2O$, or the solvent consisting of 30 parts of acetic acid, 5 parts of HF, and 1 part of $HNO_3$. Alternatively, removal of portion 253 can be achieved by using dry-etching under $CF_4$ plasma.

Figure 11:
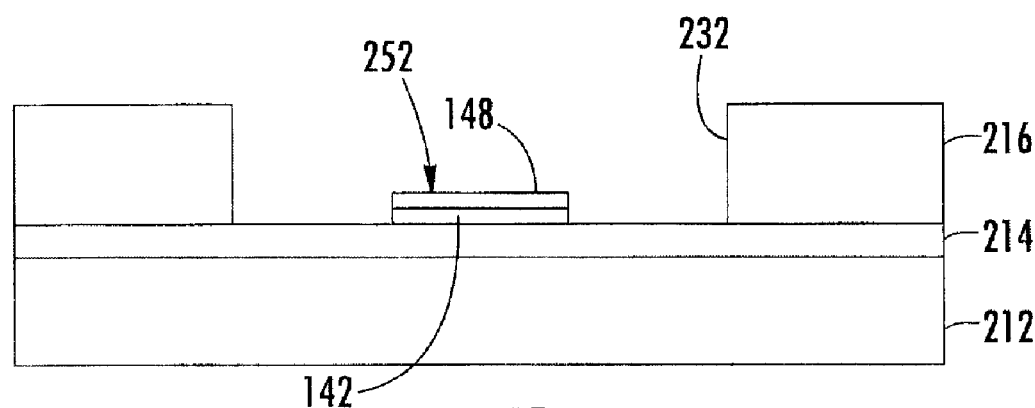
FIG. 11 is a sectional view illustrating further removal of portions of the embossing layer according to one exemplary embodiment.

FIG. 11 illustrates further removal of portions of embossing layer to expose carrier substrate 212 and/or release layer 214. In particular, portions of embossing layer 216 are removed using the same methods (including oxygen plasma etching, UV-ozone treatment and laser ablation) that are used to remove floor 237 of channel 236 in FIG. 6. The removal of material results in channel 232 in embossing layer 216, initially formed by imprinting as shown in FIGS. 5 and 6, being deepened such that channel 232 extend to release layer 214 or carrier substrate 212 shown in FIG. 11. As a result, side edges of the portion 252 can be exposed.

FIGS. 12 and 12A illustrate further treatment of those exposed surfaces of portion 252 such that the expose surfaces become dielectric or are coated with a dielectric material. In one embodiment, as shown in FIG. 12A, those exposed surfaces of portion 252 are anodized in a process similar to the anodization step shown and described with respect to FIG. 9. The metal oxide formed along the edge of portion 252 prevents or reduces likelihood of a short circuit.

In other embodiments, other treatments may be used to insulate the interior regions of portion 252. For example, thermal annealing may be used to grow a metal oxide at the edges. In such an embodiment, the annealing temperature should be selected so as to not exceed a tolerance temperature of the substrate 212.

FIG. 13 illustrates heat being applied to dielectric layer 148, annealing of portions of layer 148 to remove moisture. The heat applied preferably does not exceed the tolerance temperature of substrate 112.

FIGS. 14 and 14A illustrate forming of conductor 138. In particular, metallic material is deposited within channels 232. As its thickness increases, the metal layer will extend horizontally and cover or span across the dielectric layer 148 overlying conductor 142. The deposition timing should be controlled such that conductor 138 achieves a sufficient thickness spanning across dielectric layer 148 and conductor 142 to reliably conduct electrical charge.

In the particular example shown, the metals forming conductor 138 are deposited by electro-deposition or electroplating. As shown by FIG. 14, the electroplating is performed by using electrically conductive carrier substrate 212 and/or a conductive release layer 214 as a cathode, an anode 268 of suitable material such as platinum or nickel, an electrolyte 270 and a voltage source 272. Electrolyte 270 may include selective additives which in conjunction with the use of suitable voltages, pulses, and reverse pulses applied by voltage source 272 results in conductor 138 completely extending over and in contact with the dielectric layer 148 as thickness of conductor 138 increases. In one embodiment, the voltage applied by voltage source 272 is maintained above the voltage threshold of dielectric layer 148 such that metallic material is deposited over dielectric layer 148. In other embodiments, the voltage applied by voltage source 272 may be below the voltage threshold of dielectric layer 148, wherein the voltage is applied for a sufficient period of time such that conductor 138 still bridges across dielectric layer 148 and conductor 142, forming crossover 150.

In the particular example shown, conductor 138 comprises one or more metals that are capable of electrochemical deposition with good conductivity such as nickel, copper, silver and gold. In other embodiments, other techniques may be employed for depositing the metallic material of conductor 138.

FIG. 15 illustrates coupling of a substrate 122 to dielectric layer 126 and conductor 138 by adhesive 124. Substrate 122 and adhesive 124 are described above with respect to FIGS. 2 and 3.

Figure 16:
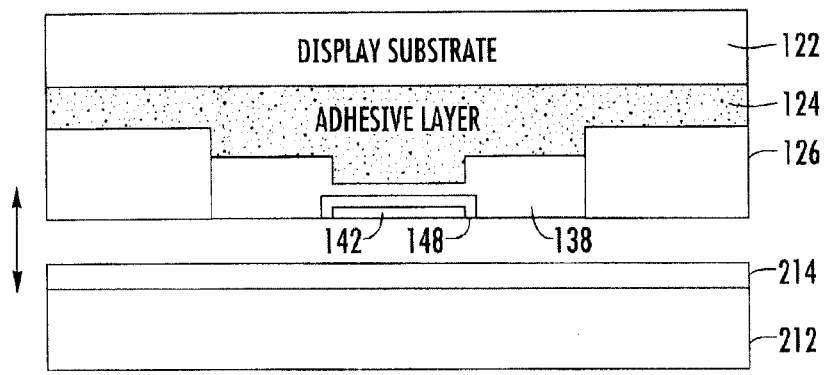
FIG. 16 is a sectional view illustrating separation of the carrier substrate according to one exemplary embodiment.

FIG. 16 illustrates separation of carrier substrate 212 and release layer 214. Thereafter, additional layers or electronic components may be added to form or complete the electronic device including backplane 120. For example, switching devices, such as transistors as well of electro-optical material may be added. In particular embodiments some switching devices or wells for electro-optical material may be formed during the step shown and described with respect to FIGS. 4-15. In some embodiments, dielectric layer 216 may be utilized to form other structures such as pixel wells and the like. Although backplane 120 is illustrated as a planar form, in other embodiments the backplane may be arcuate or deformed to an arcuate shape given a flexible substrate 122.

Figure 17:
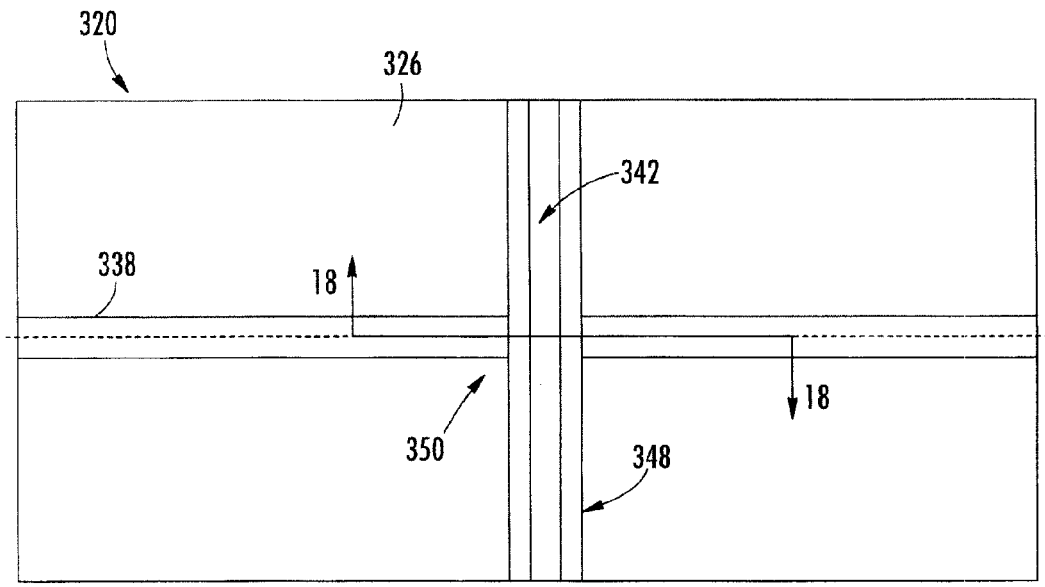
FIG. 17 is a top plan view of another embodiment of the electronic device backplane of FIG. 2 including a particular embodiment of a crossover according to an example embodiment.
Figure 18:
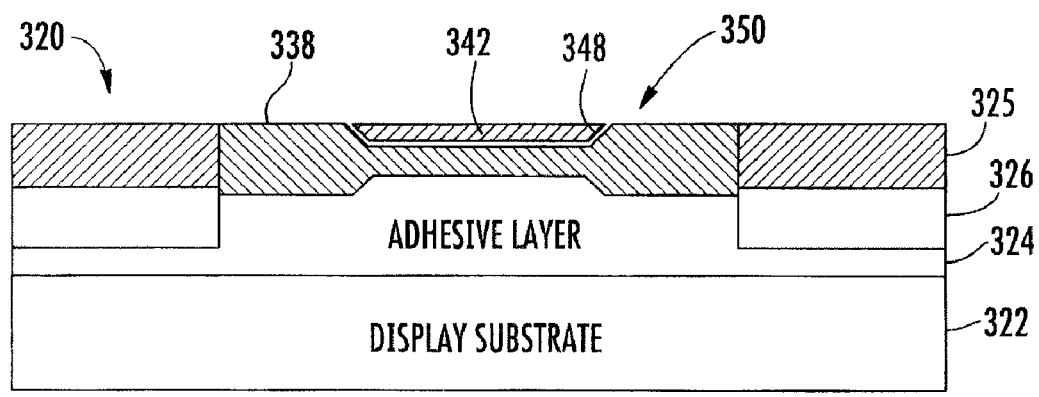
FIG. 18 is a sectional view of the backplane of FIG. 17 taken along a line 18-18 according to an example embodiment.

FIGS. 17 and 18 illustrate a portion of an electronic device backplane 320 including crossovers 350, a particular example of one of crossovers 50 shown in FIG. 1. FIG. 17 is a top plan view of backplane 320. FIG. 18 is a sectional view of backplane 320 taken along line 18-18 of FIG. 17. Backplane 320 includes substrate 322, adhesive 324, dielectric layer 325, dielectric layer 326, conductor 338, conductor 342 and dielectric layer 348 which forms crossover 350. Substrate 322 supports dielectric layers 325, 326, conductor 338, conductor 342 and dielectric layer 348. In the example illustrated, dielectric layers 325, 326, conductor 338, conductor 342 and dielectric layer 348 are collectively joined, bonded, adhered or laminated to substrate 322 by adhesive 324. In one embodiment, substrate 322 comprises a polymeric or plastic substrate, such as polyethyleneteraphalate (PET), facilitating roll-to-roll fabrication. In another embodiment, substrate 322 comprises a glass substrate. In one embodiment in which substrate 322 is formed from PET, substrate 322 has a thickness of between about 50 microns and about 200 microns. In other embodiments, substrate 322 may be formed from other materials and may have other thicknesses.

Adhesive 324 comprises a layer of one or more materials configured to adhesively contact dielectric layer 325 and conductor 338 so as to join such layers to substrate 322. In one embodiment, adhesive 324 comprises NOA81, an adhesive supplied by Norland Products, Inc. In one embodiment, adhesive 324 has a thickness of between about 5 microns and 20 microns. In other embodiments, adhesive 324 may be formed from other materials and may have other thicknesses.

Dielectric layer 325 comprises a layer of one or more dielectric organic materials configured to be later removed or sacrificed in the formation of backplane 320. Dielectric layer 325 may comprise any material having a differential etch rate. In one embodiment, dielectric layer 325 comprises a positive photoresist that, after exposure to UV radiation, can be dissolved by a solvent. In another embodiment, dielectric layer 325 comprises a negative photoresist that may need much higher UV radiation dosage to be fully cured than that needed by the dielectric layer 326. In both cases, the dielectric layer 325 can be partially dissolved away by a solvent after the layer 326 is fully cured. In the specific example illustrated, dielectric layer 325 has a relatively small thickness $T_1$ of less than 2 micrometers.

Dielectric layer 326 comprises one or more layers of one or more dielectric materials extending about and along opposite sides of conductor 338 and dielectric layer 348. In one embodiment in which boundaries of conductors 338 and 342 and dielectric layer 348 are at least partially defined by embossing or imprinting made into layer 325, layer 326 is formed from one or more dielectric materials configured to be embossed or imprinted and to subsequently be cured or solidified. In one embodiment, dielectric layer 326 may be formed from a photo curable material. One example of such a photo curable material is SU8 commercially available from Micro-Chemical Corporation. In other embodiments, other photo curable dialectic materials maybe used to form layer 326.

Conductors 338, 342 comprise lines or traces of electrically conductive material formed upon substrate 322 and configured to conduct electrical current. In particular example illustrated, conductor 338 is formed from one or more metals capable of electrolytic deposition and good conductivity. Examples of such metals include, but are not limited to, nickel, copper, silver, gold, tantalum and palladium. Conductor 342 comprises an electrically conductive material configured to be anodized. Examples of such materials, include, but are not limited to, tantalum, aluminum, niobium, tungsten and alloys thereof. In other embodiments, other conductive materials may be employed. Conductors 338, 342 may serve as address lines and signal lines in an electronic device similar to lines 38 and 42 in device 20 shown in FIG. 1.

Dielectric layer 348 comprises a layer of sufficient thickness and of one or more selected materials so as to electrically insulate conductors 338 and 342 from one another at crossover 350. Layer 348 extends along three sides (as shown in FIG. 3) of conductor 342. Layer 348 is sandwiched between conductor 342 and conductor 338. In the example illustrated, layer 348 is integrally formed as part of a single unitary body with the material of conductor 342, wherein layer 348 comprises anodized portions of the material of conductor 342. In contrast to the unanodized material of conductor 342, the anodized material forming layer 348 is dielectric. Because layer 348 forming crossover 350 is formed from anodized portions of the same material deposited to form conductor 342, fabrication complexity and cost may be reduced. For example, because dielectric layer 348 is formed by anodization, photolithography may be eliminated or reduced, reducing cost and facilitating fabrication of ultra-large displays or other electronic devices. Because layer 342 is formed using anodization, low-pressure/high-temperature processes may be reduced or eliminated, facilitating use of a polymeric substrate 322. In addition, because substrate 322 may be polymeric, backplane 320 may be formed as part of a roll-to-roll process.

Figure 19:
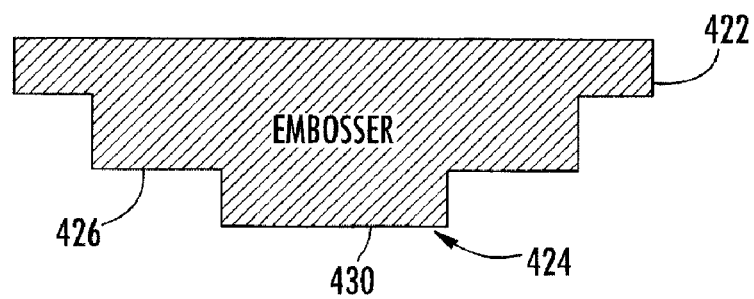
FIG. 19 is a sectional view schematically illustrating coupling of an embossing layer upon a carrier substrate according to one exemplary embodiment.
Figure 19:
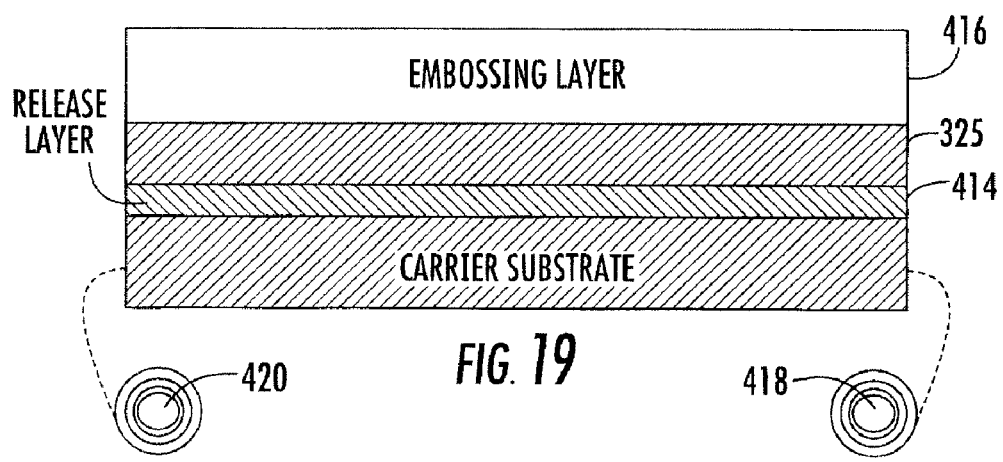
Figure 20:
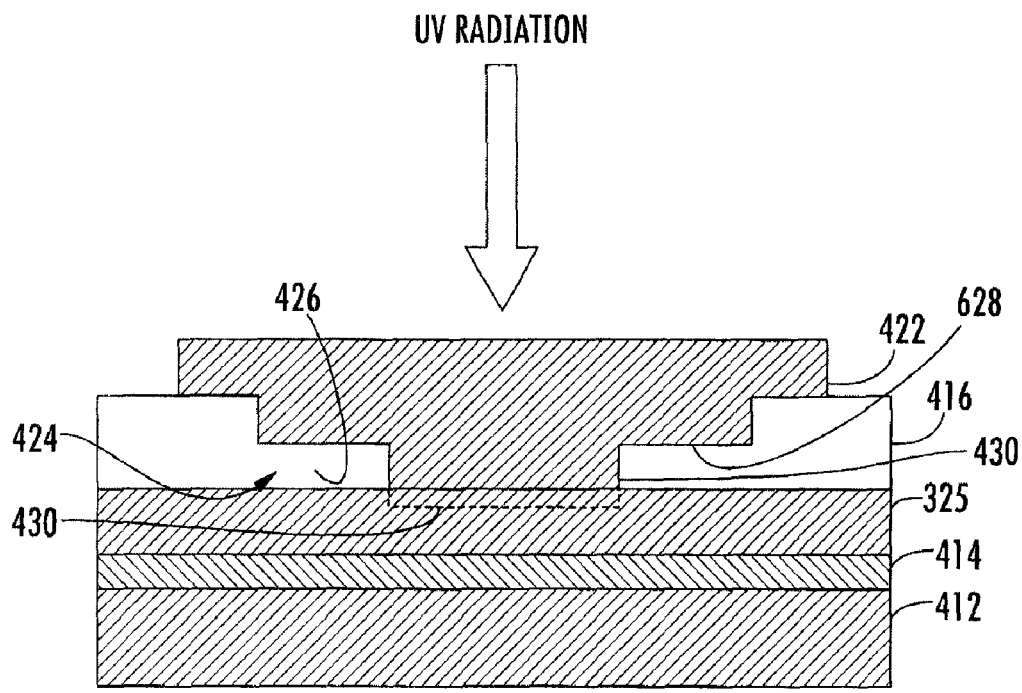
FIG. 20 is a sectional view schematically illustrating embossing or imprinting of the at least one embossing layer according to one exemplary embodiment.

FIGS. 19-31 illustrate the embossing or imprinting upon of embossing layer 416 by embosser 422. As shown by FIGS. 19 and 20, embosser 422 comprises a shim including a relief surface 424. Relief surface 424 is configured to form features within embossing layer 416 corresponding to size or edges of conductor 338 and conductor 342. In the particular example shown, relief surface 424 includes projections 426 and 430. Projection 426 forms a channel 432 (shown in FIG. 21) within embossing layer 416 which generally corresponds to the outline of conductor 338. Projection 430 extends beyond projection 426 and is configured so as to project into layer 416 so as to form channel 436 (shown in FIG. 21) which generally has a shape or outline of conductor 342. In one embodiment, projection 430 projects less than or equal to about 1 micron beyond projection 426. This height of projection 430 substantially defines a thickness or height of conductor 342.

Figure 21:
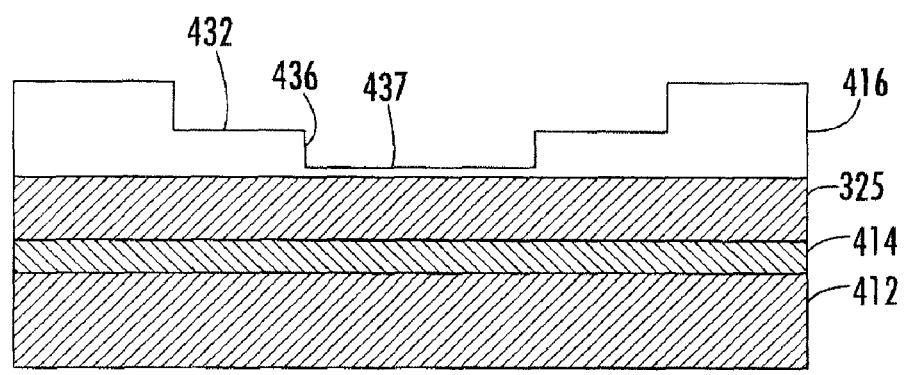
FIG. 21 is a sectional view schematically illustrating the imprinted embossing layer 21 according to one exemplary embodiment.

In the particular example shown, embossing layer 416 is formed from one or more dielectric materials such that embossing layer 416 has a deformable shape until treated. In the particular example shown, embossing layer 416 comprises an optically transparent UV curable dielectric resin (e.g., Norland Optical Products NOA83H). As a result, upon the application of UV illumination, the shape of embossing layer 416 becomes stabilized. In the particular example shown, embosser 422 is substantially transparent to UV wavelengths. Once embosser 422 has been positioned into layer 416 such that layer 416 takes up the form or shape of relief surface 424 as shown in FIG. 5, UV illumination is applied through embosser 422 to embossing layer 416 to cure and solidify or stabilize the shape of embossing layer 416 while embosser 422 is in place. Thereafter, as shown in FIG. 21, embosser 422 is separated from layer 416 to expose and reveal channels 432 and 436.

In other embodiments, embossing layer 416 may comprise one or more other materials such that embossing layer 416 may be treated to stabilize the shape of embossing layer 416 by other means such as by heat, chemical reactions, thermosetting reactions, curing or cross-linking, induction heating, microwave and other forms of electromagnetic radiation and the like, while embosser 422 is positioned into layer 416 or upon removal of embosser 422 from layer 416. In still other embodiments, embossing layer 416 may be provided by other materials which do not require treatment to achieve a stabilized shape or which require treatment to achieve a deformable state which naturally stabilizes and shapes over time or which may require further treatment for shape stabilization. Although in the particular example illustrated, embossing layer 416 is formed from one or more transparent materials, in other embodiments, embossing layer 416 may alternatively be opaque such as in those embodiments in which at least those portions of embossing layer 416 which overlie or underlie electrical optical media 32 (shown in FIG. 1) are removed during the manufacture of the display in which backplane 320 is to be used.

Figure 22:
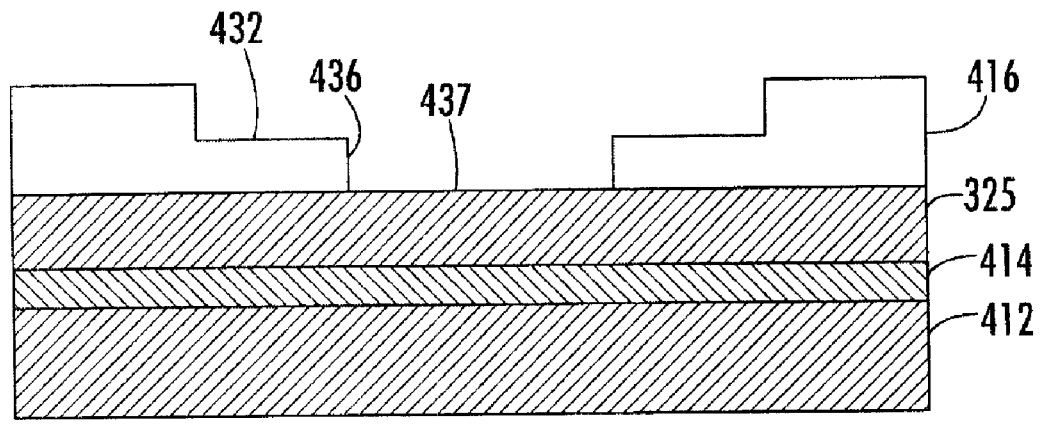
FIG. 22 is a sectional view of the opening through the embossing layer of FIG. 21 according to an example embodiment.

FIG. 22 illustrates further deepening of channel 436 so as to expose dielectric layer 325. In particular, floor 437 (shown in FIG. 21) of channel 436 is removed. Examples of methods that may be used to remove floor 437 so as to deepen channel 436 and expose layer 325 include an anisotropic etching techniques such as oxygen plasma etch. Other removal techniques include UV-ozone treatment and laser ablation. In still other embodiments methods to expose layer 325 include reactive ion etching, wet etching or ion beam milling. In particular applications, the embossing or imprinting of layer 416 may be performed such that channel 436 omits a floor 437 and exposes layer 325.

Figure 23:
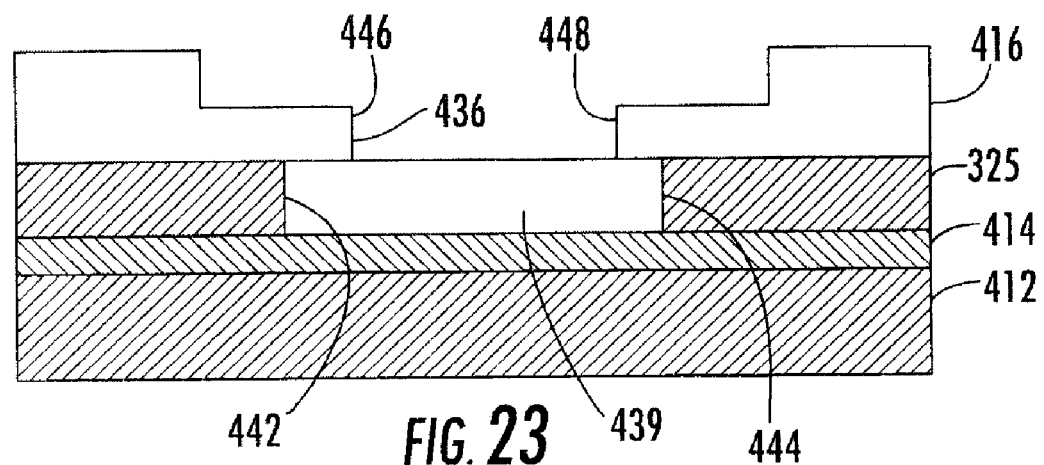
FIG. 23 is a sectional view illustrating removal of portions of a sacrificial layer underlying the embossing layer to form a recess according to an example embodiment.

FIG. 23 illustrates removal of portions of dielectric layer 325 through channel 436 to form a recess 439 within dielectric layer 325. Recess 439 is bordered by side edges 442 and 444. As further shown by FIG. 23, portions of layer 325 are removed so as to additionally form overhangs 446 and 448 along sides 442 and 444, respectively. Overhangs 446, 448 are provided by portions of the material of embossing layer 416 extending over recess 439 along a depression or channel 436. In particular embodiments, portions of overhangs 446, 448 may also include portions of layer 325.

In the particular example illustrated, portions of dielectric layer 325 are removed by wet or dry etching. Other material removal techniques may alternatively be utilized depending upon the materials of dielectric layer 325.

Figure 24:
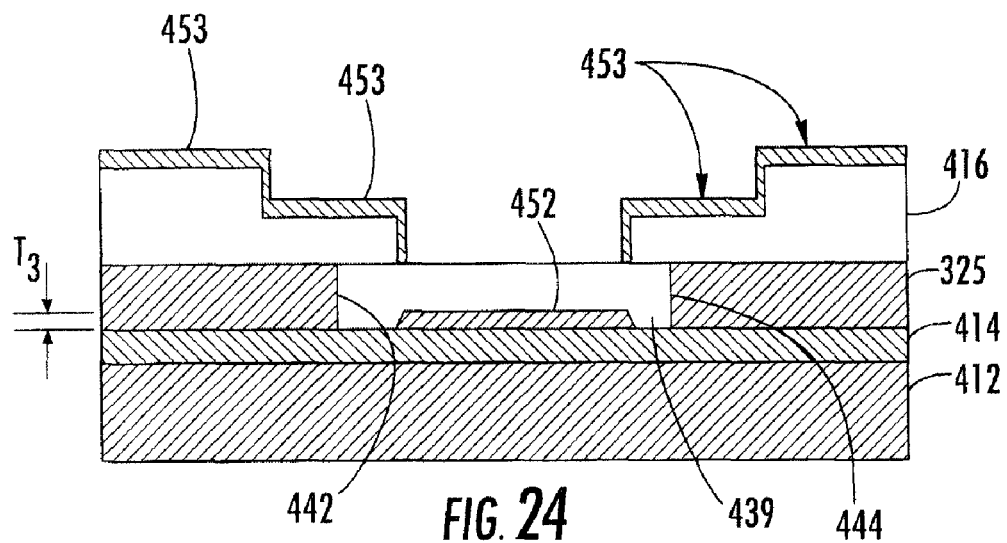
FIG. 24 is a sectional view illustrating deposition of a first metal in the recess of FIG. 23 according to one exemplary embodiment.

FIG. 24 illustrates depositing metal portion 452 in recess 439. As shown by FIG. 24, the metallic material being deposited to form metal portion 452 may cover or coat at least portions of layer 416, forming portions 453. In the example shown in FIG. 24, the metallic material of portions 452 and 453 may be deposited using such methods as thermal evaporation and sputtering. In one embodiment, portions 452 and 453 comprise tantalum. In other embodiments, the metallic material may comprise other metals whose oxides function as high-quality dielectrics such as niobium, titanium, copper, silver, aluminum, tungsten, and their alloys. In the particular example shown, metal portion 452 has a minimum thickness $T_3$ of at least 50 nm to provide sufficient material for anodization (shown in the next step) and sufficient conductivity to allow electrical current flow and a maximum thickness not exceeding the thickness of the sacrificial layer such that a lift-off process may be implemented. In the particular example shown, metal portion 452 has a thickness $T_3$ of 200 nm. In other embodiments, metal portion 452 has other thicknesses.

Figure 25:
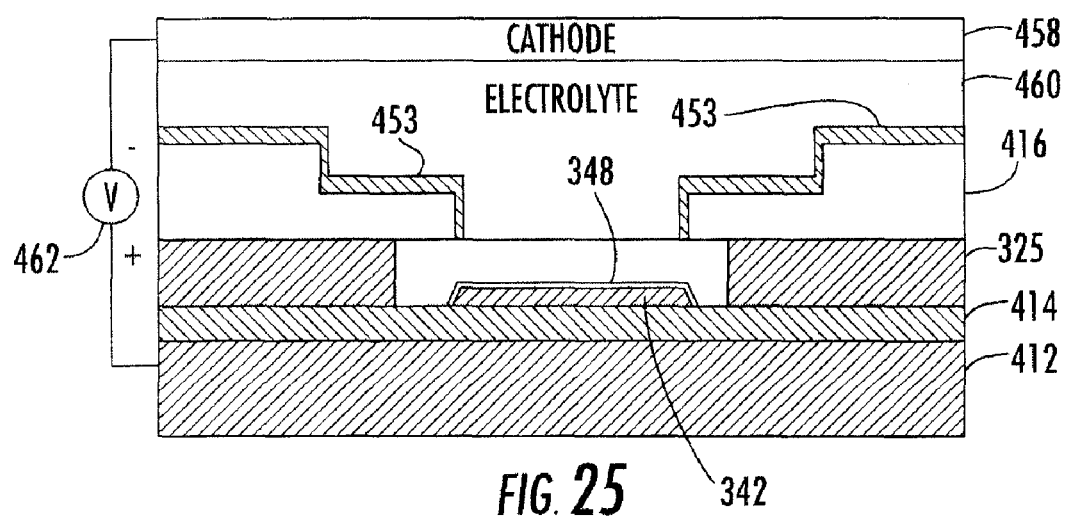
FIG. 25 is a sectional view schematically illustrating anodization of the first metal within the recess to form a dielectric layer according to an example embodiment.

FIG. 25 illustrates anodization of metal portion 452 to form dielectric layer 348. Those portions of metal portion 452 that are not anodized or oxidized remain electrically conductive. In particular, metal portion 452 is anodized using a galvanic cell utilizing conducting substrate 412 as an anode, a cathode 458 of a suitable metal, such as platinum and a suitable electrolyte 460. In the example shown, the electrolyte may comprise a solution of citric acid. In other embodiments, electrolyte 260 may comprise a boric acid solution with pH adjusted to 7 by $NH_4OH$, a solution of ammonium tartrate, or a solution of ammonium pentaborate. In one embodiment, an example concentration is: citric acid—0.01 wt. %, all others—1 wt %. Electrolyte 260 may also include other surfactants and/or buffer materials. In one embodiment, the anodization regime is galvanostatic.

In the particular example shown in which metal portion 452 comprises tantalum having an anodization coefficient of approximately 1.8 nm/volt, voltage source 462 applies a starting current density of approximately 0.1 mA to 1.0 mA per centimeter squared. After the voltage reaches a specific value (final thickness of the $Ta_2O_5$ film is proportional to the voltage), the regime is switched to a potentiostatic regime wherein the voltage source 462 applies a relatively constant voltage to complete anodization of metal portion 452 until the current density falls to a sufficiently low value. The voltage applied by voltage source 462 and the time that the anodization is performed at constant voltage determines the thickness of dielectric layer 348.

In the particular example shown, to form a 100 nm $Ta_2O_5$ film for dielectric layer 348, voltage source 462 applies a generally constant voltage of 55V at room temperature during the final stage. As shown by FIG. 25, portions 453 are sufficiently insulated from the electrically conductive substrate 412 and therefore are not anodized. In other embodiments, the voltage applied by voltage source 462 may be varied to vary the thickness of dielectric layer 348.

Figure 26:
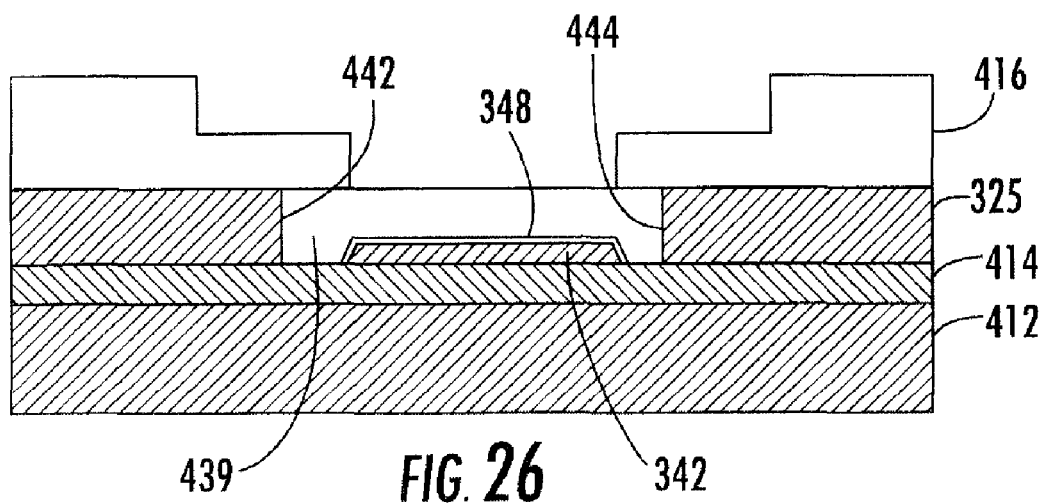
FIG. 26 is a sectional view illustrating removal of the first metal from the embossing layer according to one exemplary embodiment.

FIG. 26 illustrates removal of metallic portion 453 (shown in FIG. 25) from portions of embossing layer 416. In the particular example shown, portions 453 are removed by etching such as with a dry etch or a wet etch. The etching technique chosen provides a sufficient differential etch rate between the portion 453 and dielectric layer 348. In the particular example shown, removal of portion 453 can be achieved by wet-etching using acid based solvents such as the solvent consisting of 1 part 48% HF, 2 parts concentrated $HNO_3$, and 1 part $H_2O$, or the solvent consisting of 30 parts of acetic acid, 5 parts of HF and 1 part of $HNO_3$. Alternatively, removal of portion 453 can be achieved by using dry-etching under $CF_4$ plasma.

Figure 27:
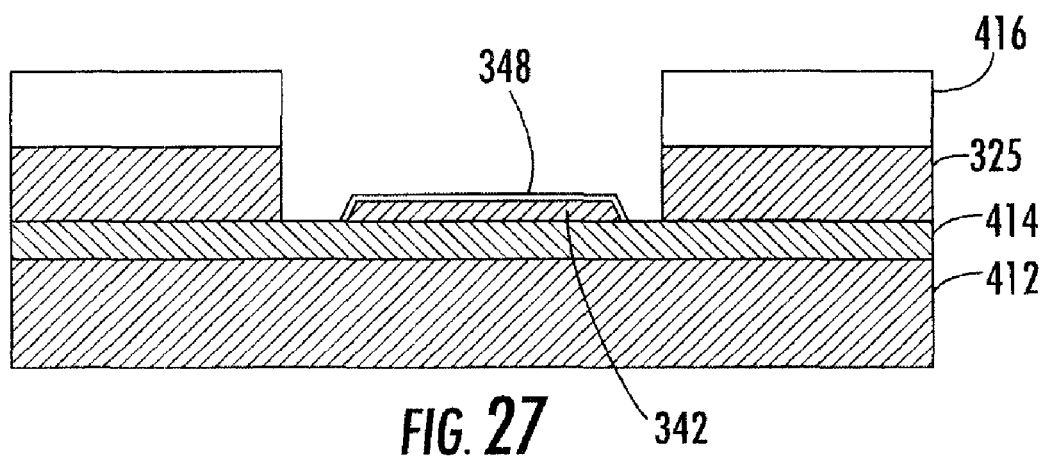
FIG. 27 is a sectional view illustrating further removal of portions of the embossing layer according to one exemplary embodiment.

FIG. 27 illustrates further removal of portions of embossing layer 416 and dielectric layer 325 to expose carrier substrate 412 and/or release layer 414. In particular, portions of embossing layer 416 and layer 325 are removed using the same methods (including oxygen plasma etching, UV-ozone treatment and laser ablation) that are used to remove floor 437 of channel 436 in FIG. 21. The removal of material results in channels 432 in embossing layer 416, initially formed by imprinting as shown in FIG. 21, being deepened such that channel 432 extends to release layer 414 or carrier substrate 412 shown in FIG. 27.

Figure 28:
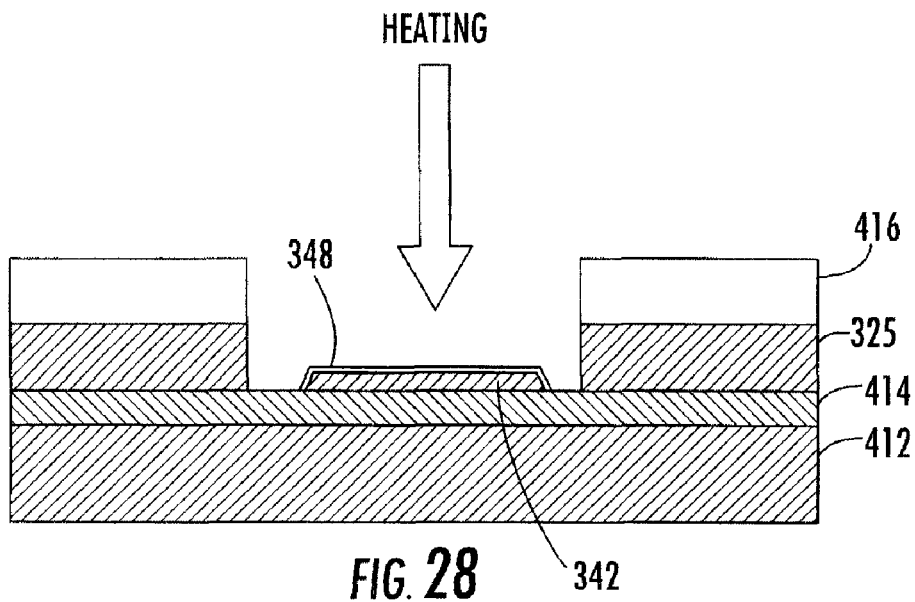
FIG. 28 is a sectional view illustrating annealing of the dielectric layer according to one exemplary embodiment.

FIG. 28 illustrates heat being applied to dielectric layer 348, annealing of portions to removes moisture. The heat applied preferably does not exceed the tolerance temperature of substrate 412.

Figure 29:
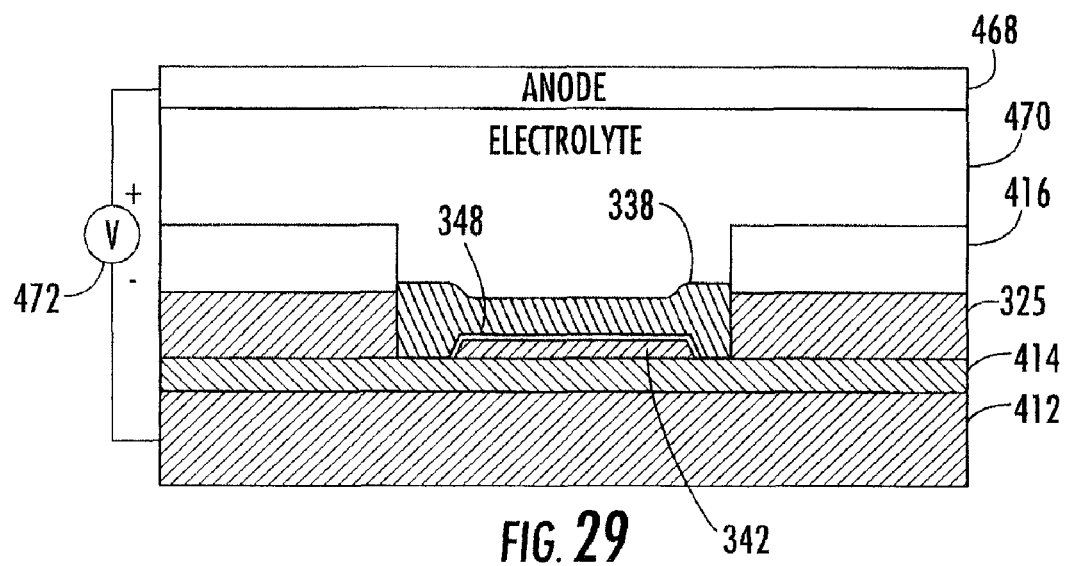
FIG. 29 is a sectional view of the electrodeposition of a second metal over the dielectric layer to form a crossover according to an example embodiment.

FIG. 29 illustrates forming of conductor 338. In particular, metallic material is deposited within channels 432. As its thickness increases, the metal layer will extend horizontally and cover or span across the electric layer 348 overlying conductor 342. The deposition timing should be controlled such that conductor 338 achieves a sufficient thickness spanning across dielectric layer 348 and conductor 342 to reliably conduct electrical charge.

In the particular example shown, the metals forming conductor 338 are deposited by electro-deposition or electroplating. As shown by FIG. 29, the electroplating is performed by using electrically conductive carrier substrate 412 and/or a conductive release layer 414 as a cathode, an anode 468 of suitable material such as platinum or nickel, an electrolyte 470 and a voltage source 472. Electrolyte 470 may include selective additives which in conjunction with the use of suitable voltages, pulses, and reverse pulses applied by voltage source 272 results in conductor 338 completely extending over and in contact with the dielectric layer 348 as thickness of conductor 338 increases. In one embodiment, the voltage applied by voltage source 472 is maintained above the voltage threshold of dielectric layer 348 such that metallic material is deposited over dielectric layer 348. In other embodiments, the voltage applied by voltage source 472 may be below the voltage threshold of dielectric layer 348, wherein the voltage is applied for a sufficient period of time such that conductor 338 still bridges across dielectric layer 348 and conductor 342, forming crossover 350.

In the particular example shown, conductor 338 comprises one or more metals that are capable of electrochemical deposition with good conductivity such as nickel, copper, silver and gold. In other embodiments, other techniques may be employed for depositing the metallic material of conductor 338.

Figure 30:
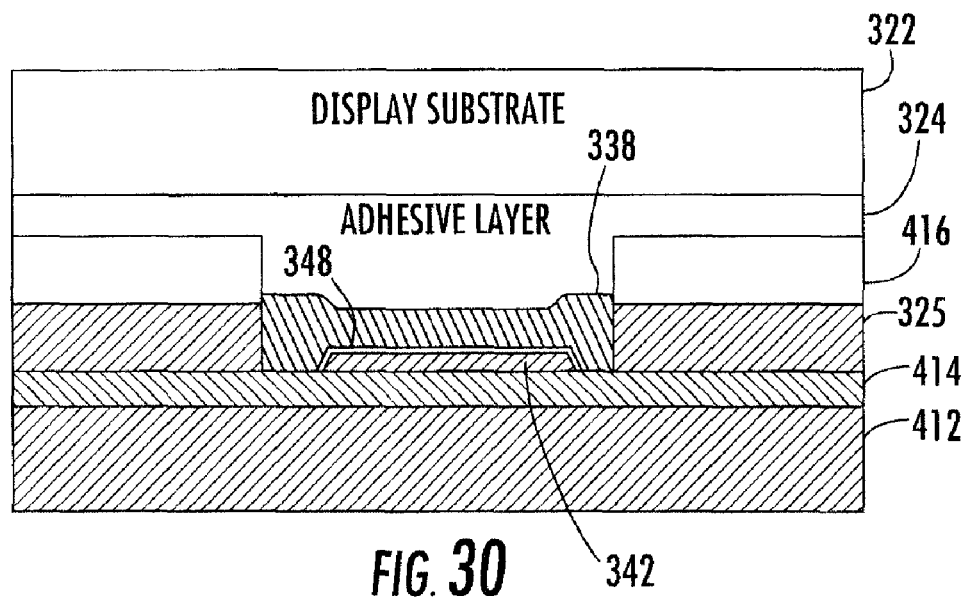
FIG. 30 is a sectional view illustrating the coupling of a display substrate according to one exemplary embodiment.

FIG. 30 illustrates coupling of a substrate 322 to dielectric layer 416 and conductor 338 by adhesive 324. Substrate 322 and adhesive 324 are described above with respect to FIGS. 17 and 18.

Figure 31:
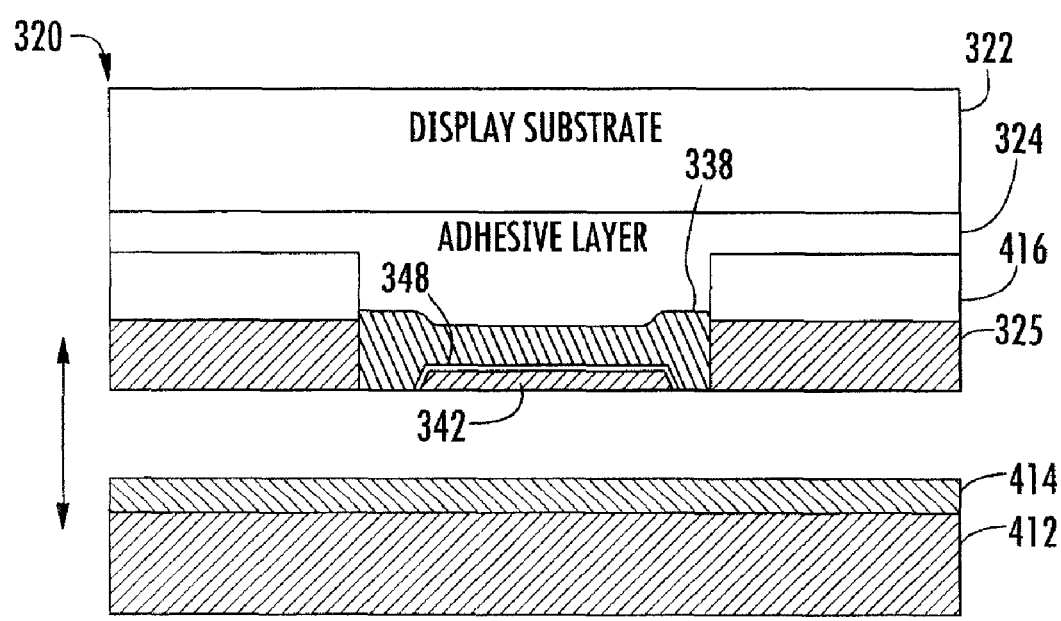
FIG. 31 is a sectional view illustrating separation of the carrier substrate according to one exemplary embodiment.

FIG. 31 illustrates separation of carrier substrate 412 and release layer 414. Thereafter, additional layers or electronic components may be added to form or complete the electronic device including backplane 320. For example, switching devices, such as transistors as well of electro-optical material may be added. In particular embodiments comes at switching devices or wells for the electro-optical material may be formed during the step shown and described with respect to FIGS. 19-30. In some embodiments, dielectric layer 416 may be utilized to form other structures such as pixel wells and the like. Although backplane 320 is illustrated as a planar form, in other embodiments the backplane may be arcuate or deformed to an arcuate shape given a flexible substrate 322.

Although the present invention has been described with reference to example embodiments, workers skilled in the art will recognize that changes may be made in form and detail without departing from the spirit and scope of the invention. For example, although different example embodiments may have been described as including one or more features providing one or more benefits, it is contemplated that the described features may be interchanged with one another or alternatively be combined with one another in the described example embodiments or in other alternative embodiments. Because the technology of the present invention is relatively complex, not all changes in the technology are foreseeable. The present invention described with reference to the example embodiments and set forth in the following claims is manifestly intended to be as broad as possible. For example, unless specifically otherwise noted, the claims reciting a single particular element also encompass a plurality of such particular elements.

What is claimed is:

1. A method of making a crossover in an electronic device, the method comprising the steps of:
   imprinting at least one first layer to form a first channel;
   depositing a first conductor in the first channel;
   anodizing a surface of the first conductor;
   electro-forming a second conductor across the first conductor, wherein the second conductor extends orthogonal to the first conductor; and
   imprinting the at least one first layer to form a second channel orthogonal to the first channel, wherein the first channel has a first depth, wherein the second channel has a second lesser depth and wherein the second conductor is formed in the second channel.

2. The method of claim 1, wherein the second conductor is formed in the second channel while the second channel is at the first depth.

3. The method of claim 1, wherein the at least one layer is formed upon a substrate and wherein the method further comprises separating the substrate from the at least one first layer.

4. The method of claim 1, wherein the at least one first layer is transparent.

5. The method of claim 1 further comprising forming the at least one first layer on an electrically conductive substrate.

6. The method of claim 5, wherein the substrate is supplied from a roll.

7. The method of claim 5 further comprising forming the at least one first layer on a release layer such that the release layer is sandwiched between the least one first layer and the electrically conductive substrate.

8. The method of claim 1, wherein the first conductor is deposited by electro-deposition.

9. The method of claim 1 further comprising laminating a display substrate on the second conductor.

10. The method of claim 1 further comprising removing a portion of at least one second layer below the first layer through the channel to deepen the first channel and to form a first overhang on a first side of the channel and a second overhang on a second opposite side of the channel prior to the depositing of the first conductor.

11. The method of claim 1, wherein the step of imprinting includes:
positioning a shim into the at least one first layer such that the at least one first layer takes a form of the shim;
treating the at least one first layer to stabilize the form; and
removing the shim from the at least one first layer.

12. The method of claim 11, wherein the shim is substantially UV transparent, wherein the at least one first layer is a UV curable material, wherein the shim is positioned into the at least one first layer prior to complete curing of the material of the at least one first layer and wherein treating includes applying UV illumination to the at least one first layer through the shim.

13. The method of claim 1 further comprising:
removing portions of the at least one first layer to expose sides of the first conductor; and
treating the exposed sides of the first conductor such that the sides become electrically insulative.

14. The method of claim 1, wherein the first conductor extends across a grid of display cells and wherein the second conductor extends across the grid of display cells.

15. A method of making a crossover in an electronic device, the method comprising the steps of:
imprinting at least one first layer to form a first channel;
a step for depositing a first conductor on the first channel;
anodizing a surface of the first conductor; and
a step for spanning a second conductor across the first conductor over the anodized surface: and
imprinting the at least one first layer to form a second channel orthogonal to the first channel, wherein the first channel has a first depth, wherein the second channel has a second lesser depth and wherein the second conductor is formed in the second channel.

16. The method of claim 15, wherein the second conductor is formed in the second channel while the second channel is at the first depth.

17. The method of claim 15, wherein the at least one layer is formed upon a substrate and wherein the method further comprises separating the substrate from the at least one first layer.

18. The method of claim 15, wherein the at least one first layer is transparent.

19. The method of claim 15 further comprising:
removing portions of the at least one first layer to expose sides of the first conductor; and
treating the exposed sides of the first conductor such that the sides become electrically insulative.

* * * * *

UNITED STATES PATENT AND TRADEMARK OFFICE
CERTIFICATE OF CORRECTION

PATENT NO. : 8,057,656 B2  
APPLICATION NO. : 12/251020  
DATED : November 15, 2011  
INVENTOR(S) : Jian-gang Weng et al.

Page 1 of 1

It is certified that error appears in the above-identified patent and that said Letters Patent is hereby corrected as shown below:

On the face page, in field (73), Assignee, in column 1, line 2, delete "LP," and insert -- L.P., --, therefor.

In column 14, line 62, in Claim 7, delete "least" and insert -- at least --, therefor.

In column 16, line 5, in Claim 15, after "conductor;" delete "and".

In column 16, line 7, in Claim 15, delete "surface: and" and insert -- surface; and --, therefor.

Signed and Sealed this
Twenty-eighth Day of August, 2012

David J. Kappos
*Director of the United States Patent and Trademark Office*